(12) United States Patent
Storms et al.

(10) Patent No.: US 7,746,125 B2
(45) Date of Patent: Jun. 29, 2010

(54) HIGH VOLTAGE DRIVER CIRCUIT WITH FAST SLOW VOLTAGE OPERATION

(75) Inventors: Maurits M. N. Storms, Best (NL); Bobby J. Daniel, Eindhoven (NL)

(73) Assignee: NXP B.V., Eindhoven (NL)

( * ) Notice: Subject to any disclaimer, the term of this patent is extended or adjusted under 35 U.S.C. 154(b) by 159 days.

(21) Appl. No.: 10/589,109

(22) PCT Filed: Feb. 8, 2005

(86) PCT No.: PCT/IB2005/050488

§ 371 (c)(1),
(2), (4) Date: Aug. 10, 2006

(87) PCT Pub. No.: WO2005/078729

PCT Pub. Date: Aug. 25, 2005

(65) Prior Publication Data

US 2007/0170958 A1 Jul. 26, 2007

(30) Foreign Application Priority Data

Feb. 11, 2004 (EP) .................................. 04100502

(51) Int. Cl.
*H03B 1/00* (2006.01)
*H03K 3/00* (2006.01)

(52) U.S. Cl. ...................... 327/112; 327/108; 326/82; 326/84

(58) Field of Classification Search ......... 327/108–112, 327/379–391.333; 326/22–27, 81–87, 62, 326/63; 365/189.11
See application file for complete search history.

(56) References Cited

U.S. PATENT DOCUMENTS

| 5,739,700 | A | 4/1998 | Martin et al. | |
| 5,889,415 | A * | 3/1999 | Parkinson | 326/68 |
| 6,407,579 | B1 | 6/2002 | Goswick | |
| 7,030,654 | B2 * | 4/2006 | Mentze et al. | 326/83 |
| 7,193,441 | B2 * | 3/2007 | Chen et al. | 326/81 |
| 2001/0000949 | A1 * | 5/2001 | Rhee | 326/85 |
| 2002/0079545 | A1 | 6/2002 | Dray et al. | |
| 2003/0112041 | A1 | 6/2003 | Clark et al. | |
| 2005/0017783 | A1 * | 1/2005 | Lee et al. | 327/333 |
| 2005/0156631 | A1 * | 7/2005 | Huang | 326/81 |
| 2006/0054952 | A1 * | 3/2006 | Schoellkopf et al. | 257/296 |

OTHER PUBLICATIONS

Wikipedia—Inveter (Logic Gate) http://en.wikipedia.org/wiki/Inverter_%28logic_gate%29.*

(Continued)

*Primary Examiner*—Lincoln Donovan
*Assistant Examiner*—Brandon S Cole

(57) ABSTRACT

A high voltage driver circuit for devices such as non-volatile memories, in which a low voltage driver is combined in two different ways with a high voltage driver In one, input-independent embodiment, a low voltage driver (Q7, Q8) is connected directly in parallel with a high voltage driver, thereby providing a high voltage signal path for high voltage operations and a low voltage signal path for low voltage operations. In an alternative, partially input-dependent embodiment, a low voltage driver is connected to the output of a high voltage driver (Q9, Q10), which may comprise a partial level shifter (Q1 B Q6). The output of this low voltage driver (Q9, Q10), which forms the output terminal of the entire stage, has a pull up/pull down transistor (Q11), depending on whether the partial level shifter (Q1 B Q6) is a positive or negative level shifting high voltage driver.

16 Claims, 16 Drawing Sheets

OTHER PUBLICATIONS

Wikipedia—Clock Signal http://en.wikipedia.org/wiki/Clock_circuit.*

Wikipedia—Integrated Circuits http://en.wikipedia.org/wiki/Integrated_circuit.*

Wikipedia—Clock Signal http://en.wikipedia.org/wiki/Clock_signal.*

Wikipedia—Inverter (logic gate) http://en.wikipedia.org/wiki/Inverter_%28logic_gate%29.*

Wikipedia—Integrated circuit http://en.wikipedia.org/wiki/Integrated_circuit.*

* cited by examiner

HIGH VOLTAGE DRIVER CIRCUIT WITH FAST SLOW VOLTAGE OPERATION

This invention relates to a voltage driver circuit and, more particularly, to a high voltage driver circuit with fast, relatively lower voltage operation.

Voltage level shifters have been used in many applications in which a voltage level higher than the one available is needed. For example, an Integrated Circuit (IC) may be required to drive a digital output pin with a logic one voltage level higher than the logic one voltage level used by the IC's internal logic. For applications in non-volatile memory circuits, such as flash memory, EPROM and EEPROM, level shifters commonly drive the wordlines (i.e. the pass transistor gates of the memory cells). For memory read operations, the required wordline driver output is usually less than or equal to the digital supply voltage Vdd. However, for memory write operations, the required output may be 10V or higher. Therefore, the write operations require a level shifter to drive the wordlines and, in order to save IC area and reduce circuit complexity, the level shifter used during write operations is usually also used during read operations, in which the required logic one output voltage must usually be less than or equal to Vdd. In such a case, the output level supply voltage Vpp tied to the level shifter is simply reduced during read operations.

Referring to FIG. 1 of the drawings, the organization of an exemplary flash memory device is illustrated schematically. The illustrated device, in respect of which read, write and erase operations can be performed, comprises a matrix of memory cells, each comprising two transistors and the matrix is divided into sectors, wherein each sector is a group of rows which are erased together during an erase operation. As shown, double gated storage transistors (providing respective control gate signals) and select transistors (providing respective select gate signals) are provided in respect of each bitline. It will be appreciated by a person skilled in the art that sector select transistors connect the sector bitlines to global bitlines.

In the illustrated example, and referring to FIG. 2 of the drawings, all control gate lines have the same voltage, i.e. Vcg=1.2V. A row to be addressed is selected by means of a select gate signal, such that it will be appreciated that the switching speed of the driver providing the select gate signal is critical. Furthermore, the sector select signal switches with a change in sector address, hence the switching speed of the driver providing the sector select signal is equally important, and it is an object of the present invention to optimize the speed of these respective drivers.

Referring to FIG. 3 of the drawings, in a specific exemplary device, during a write operation, all select gates go to Vpn=−5V and the sector select signal goes to Vdd or Vpn, depending on the sector address. The written row is selected by the control gate signal. Referring to FIG. 4 of the drawings, during an erase operation, all select gate signals go to Vpp=10V and all sector select signals go to Vpp. The erased sector is selected by the control gate voltage. Thus, referring to FIG. 5a of the drawings, the select gate driver has to deliver the following voltages, depending on the row address selected:

|  | Mode: | | |
| --- | --- | --- | --- |
|  | READ | WRITE | ERASE |
| IN | 0/Vdd | 0/Vdd | 0/Vdd |
| OUT | Vdd/0 | Vpn = −5 V | Vpp = 10 V |

High voltage drivers can be relatively simply implemented as inverters with high voltage transistors through which a high level input signal chooses between two terminal voltages which may take the following values (in respect of the specific example given above):

|  | Mode: | | |
| --- | --- | --- | --- |
|  | READ | WRITE | ERASE |
| POS | Vdd | Vpn = −5 V | Vpp = 10 V |
| NEG | 0 | Vpn | Vpp |

The level shifter can be a latch (of high voltage transistors) into which data is written through a low voltage driver, protected from the high voltage by isolation transistors. The data is written in at logic level, and the terminal voltages ramp up to the high levels, taking the latch output with them.

Referring to FIG. 5b of the drawings, the sector select driver has to deliver the following voltages:

|  | Mode: | | |
| --- | --- | --- | --- |
|  | READ | WRITE | ERASE |
| IN | 0/Vdd | 0/Vdd | 0/Vdd |
| OUT | Vdd/0 | Vdd/Vpn (−5) | Vpp = 10 |

Since the drivers use high voltage transistors to drive the heavily loaded output, the switching speed during low voltage operation is reduced. Known techniques for achieving faster switching, result in the required size of the driver becoming quite large.

It is therefore an object of the present invention to provide a high voltage driver circuit with fast low voltage operation, an integrated circuit including such a driver or memory device comprising such an integrated circuit, and a computing system including such a memory device.

In accordance with a first aspect of the present invention, there is provided a voltage driver circuit for driving a device at a selected one of a plurality of voltages associated with respective device operations including a high voltage operation and a relatively lower voltage operation, the driver circuit comprising an input, a single output for connection to said device, and a plurality of voltage drivers between said input and said output including at least one high voltage breakdown driver and at least one relatively lower breakdown voltage driver, the circuit being arranged such that, during a high voltage operation, said high voltage breakdown driver is connected to said output and there is a substantially zero voltage drop across said relatively lower breakdown voltage driver, and, during a relatively lower voltage operation, said relatively lower breakdown voltage driver provides the drive voltage for driving said device, the contribution of said high breakdown voltage driver to said drive voltage during said relatively lower voltage operation being substantially negligible.

In a preferred embodiment, the high voltage breakdown drivers comprise inverters consisting of high voltage breakdown transistors. Equally, in a preferred embodiment, the at least one relatively lower breakdown voltage driver comprises an inverter consisting of relatively lower breakdown voltage transistors. In one embodiment of the present invention, the circuit consists of two signal paths between the input and the output, a first signal path consisting of one or more high voltage drivers connected in series, and a second signal path consisting of at least one low voltage driver, the first and second signal paths being connected in parallel to one another. During high voltage operation, in this exemplary embodiment of the invention, the first signal path is selected.

In accordance with a second aspect of the present invention, there is provided a voltage driver circuit for driving a device at a selected one of a plurality of voltages associated with respective device operations including a high voltage operation and a relatively lower voltage operation, the driver circuit comprising an input, a single output for connection to said device, and a plurality of voltage drivers between said input and said output including at least one high voltage breakdown driver and at least one relatively lower breakdown voltage driver, the high voltage breakdown driver a voltage level shifter which is connected at the input between first and second voltage lines, the output of said level shifter being connected to the input of a relatively lower breakdown voltage driver connected to the output between said first and second voltage lines.

The present invention extends to an integrated circuit including a driver circuit according to the first and second aspects of the invention as defined above. Preferably the integrated circuit comprises a memory device including such a driver circuit. The present invention further extends to a computing system including such as a memory device.

The relatively lower breakdown voltage driver beneficially comprises an inverter consisting of thick gate oxide devices, such as $GO_2$ devices, or the like. It will be appreciated that such devices may already be present in an integrated circuit in the form of protection for the I/O pads. A high voltage pull-up transistor may also be provided between the output and the first voltage line.

Advantages of the present invention include faster switching times, reduced IC area (in the case of an integrated circuit implementation, and secondary use of the I/O protection inverter ($GO_2$) in an IC implementation. Several different applications of the present invention are envisaged, including high voltage applications, memory applications such as OTP, FLASH and EEPROM, and BL-display driver applications.

These and other aspects of the present invention will be apparent from, and elucidated with reference to, the embodiments described herein.

Embodiments of the present invention will now be described by way of examples only with reference to the accompanying drawings, in which.

Figure 9A:
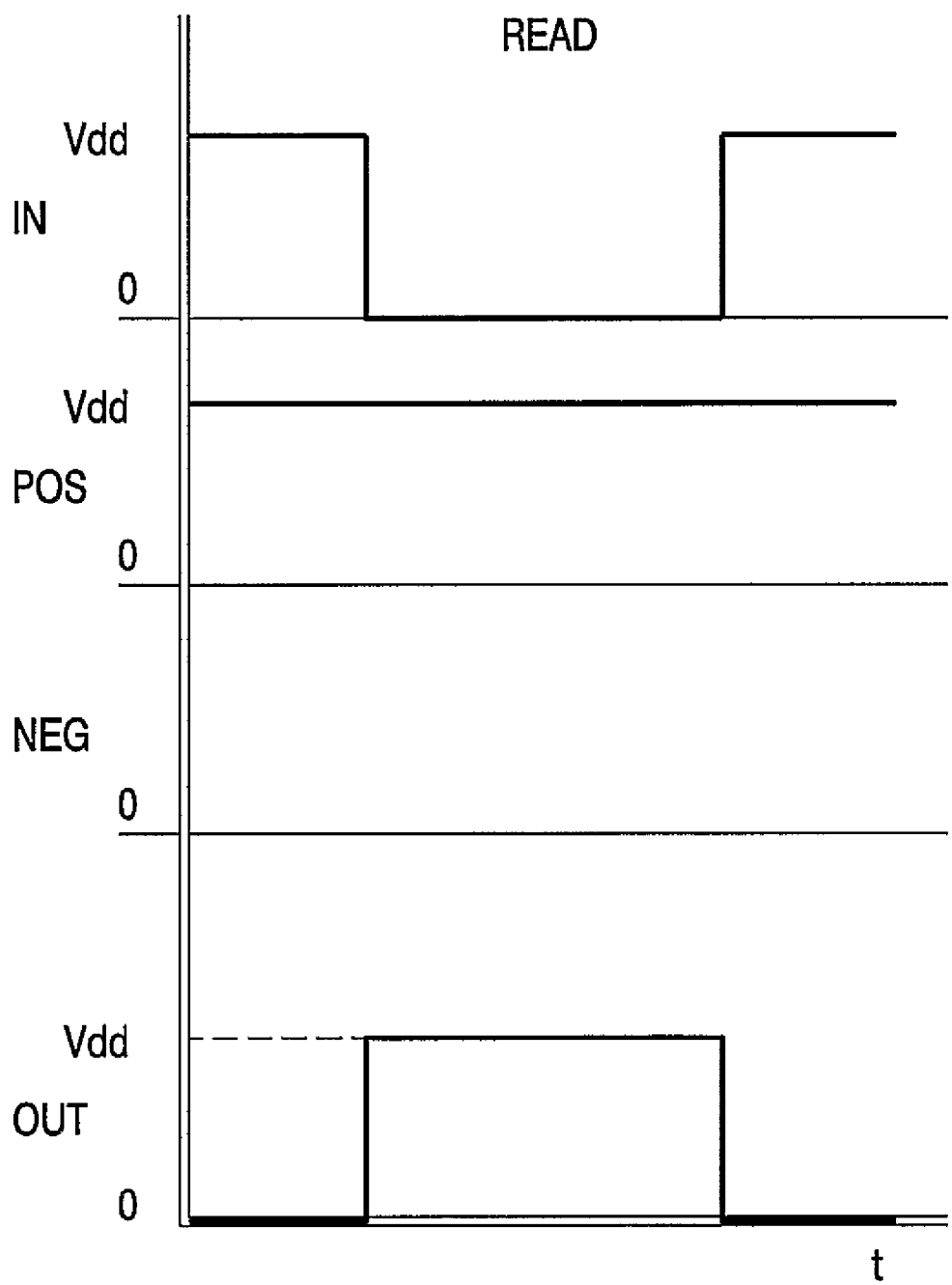
Figure 9B:
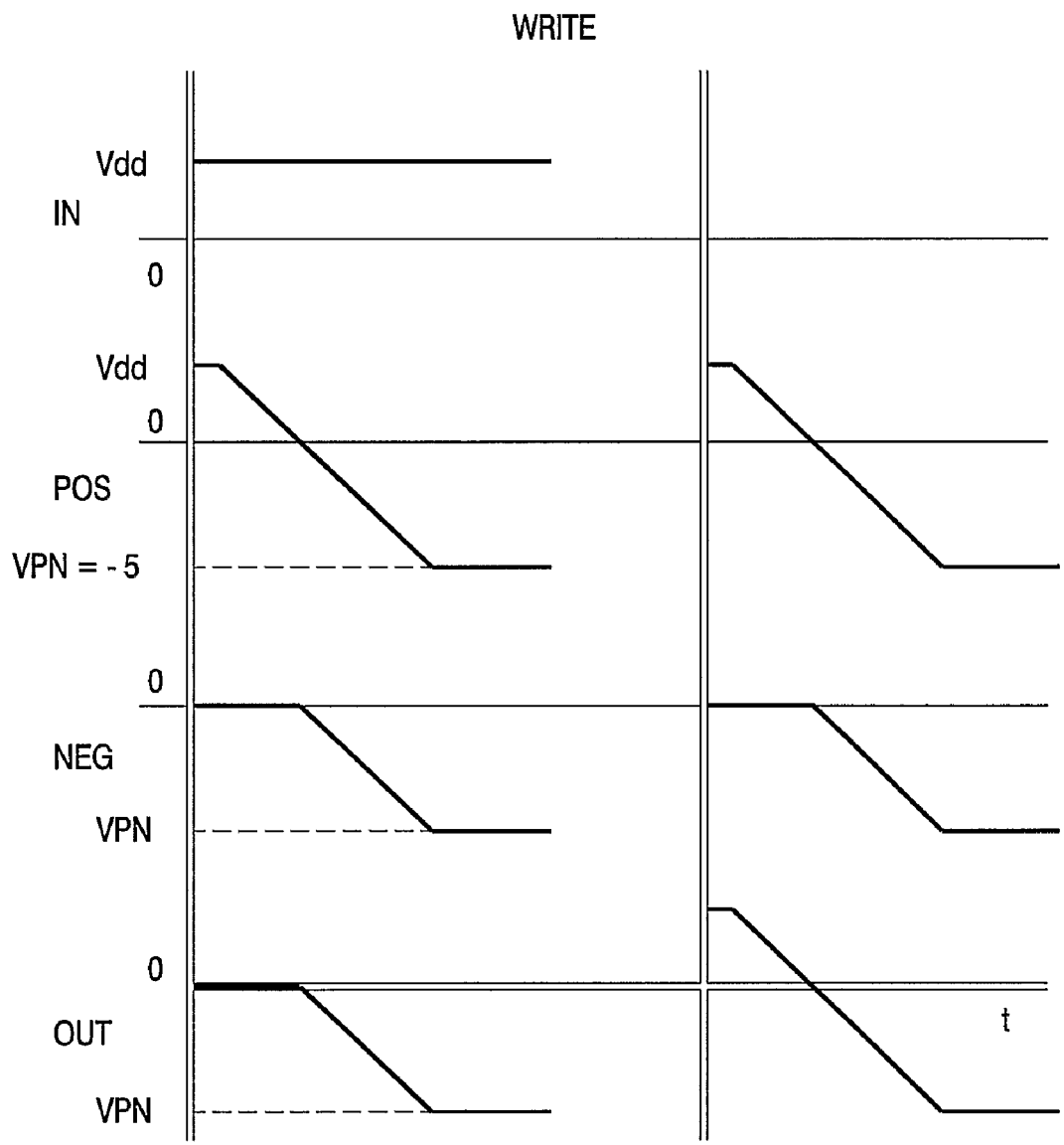
Figure 9C:
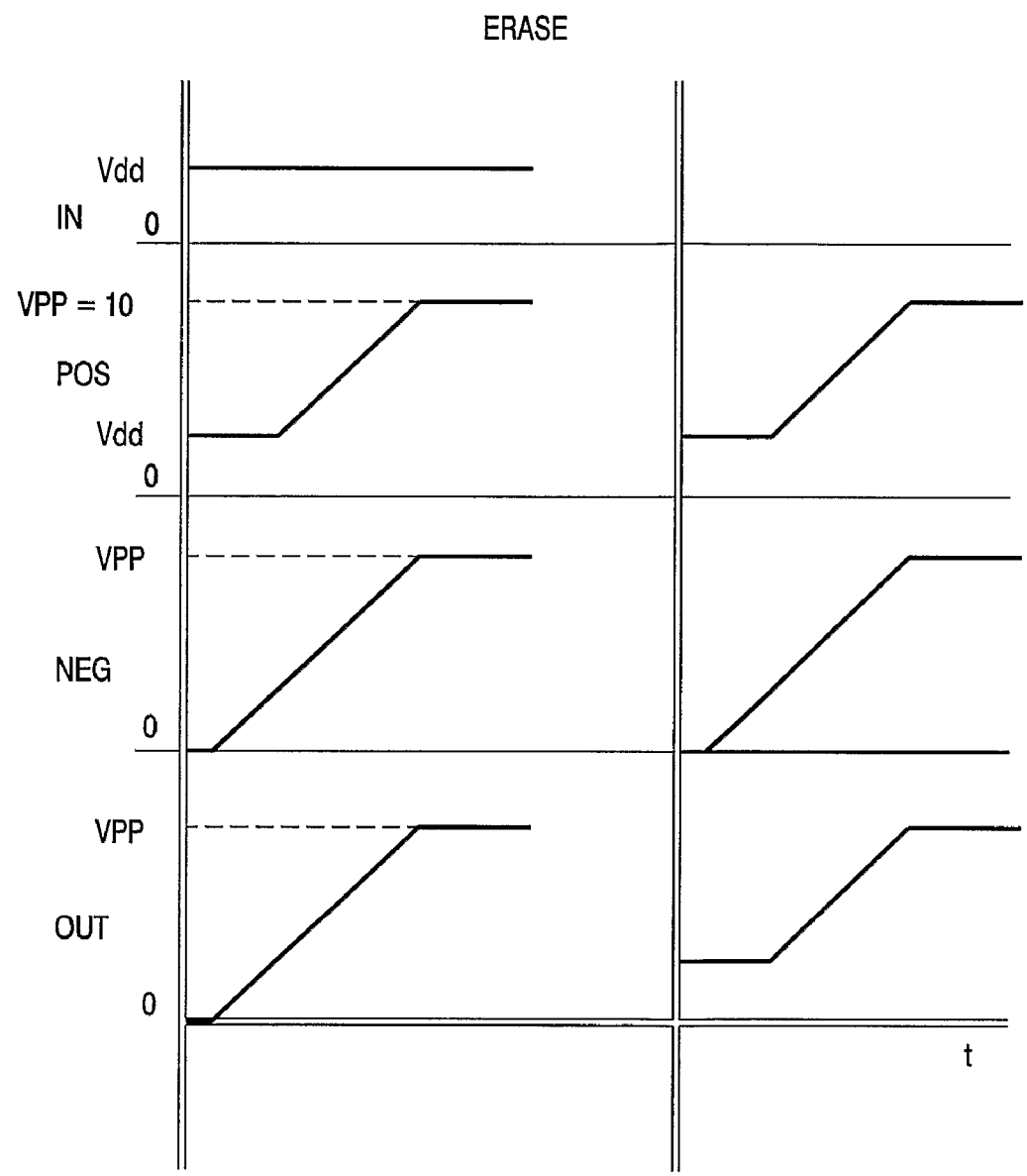
Figure 10A:
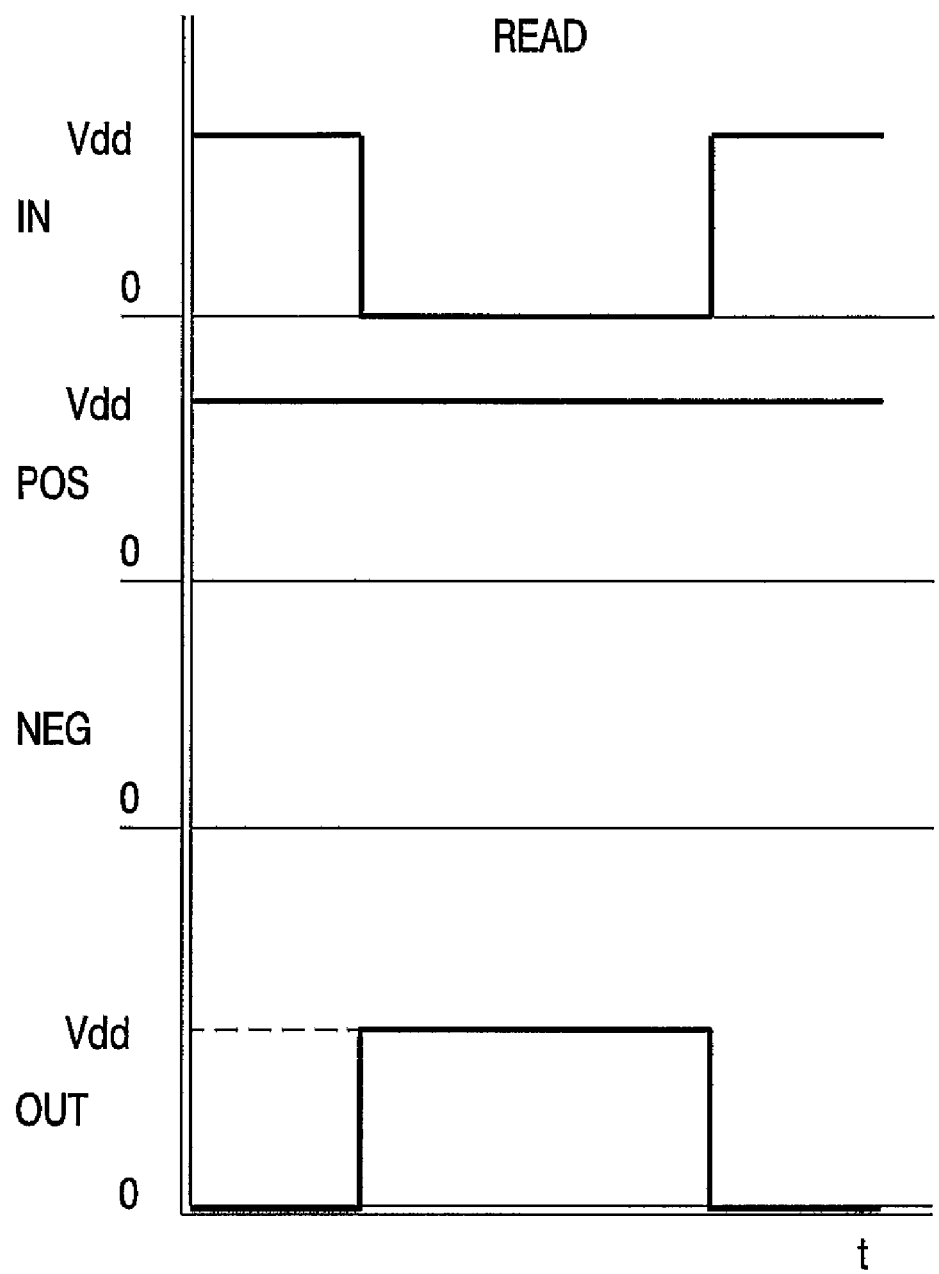
Figure 10B:
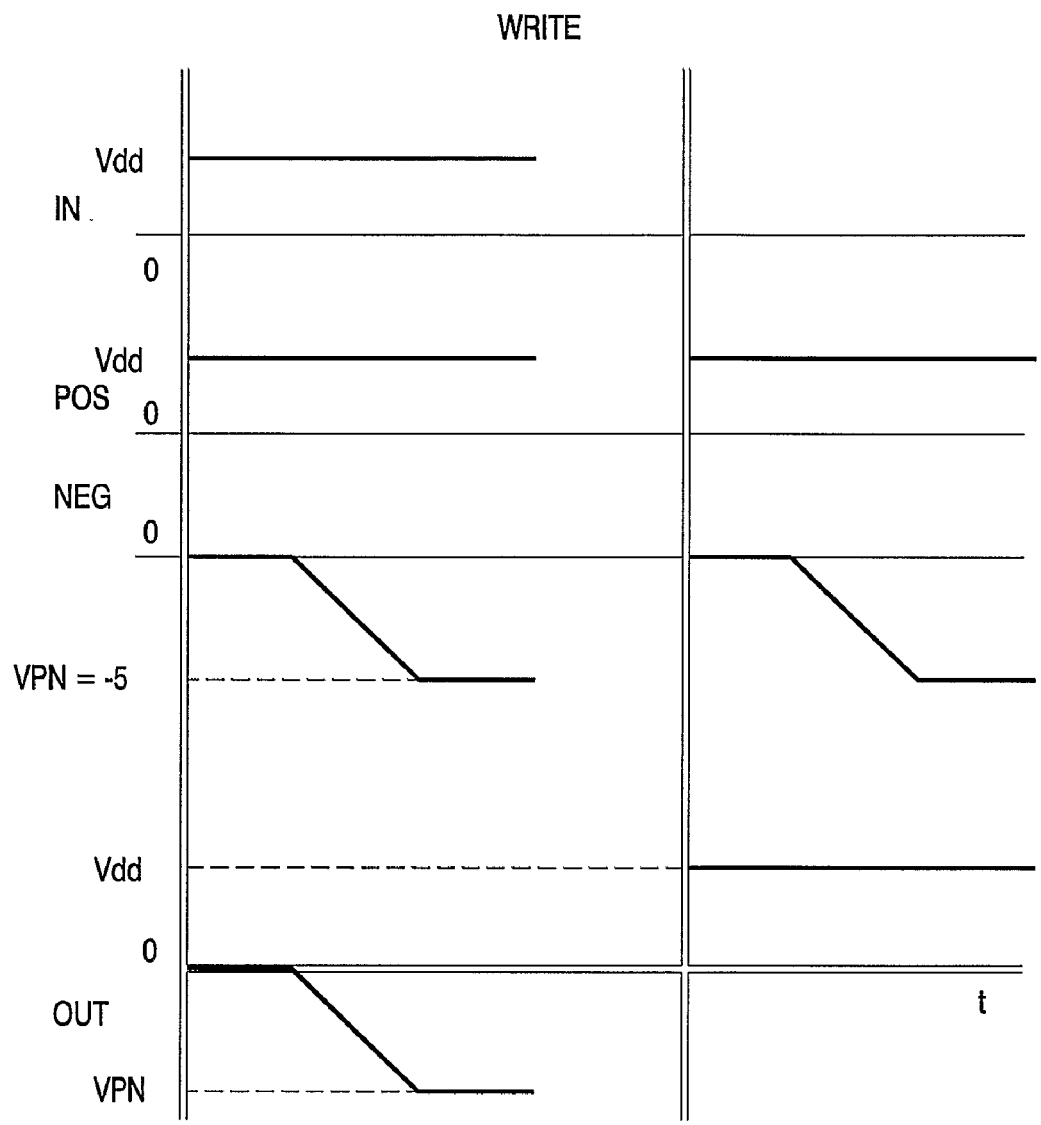
Figure 10C:
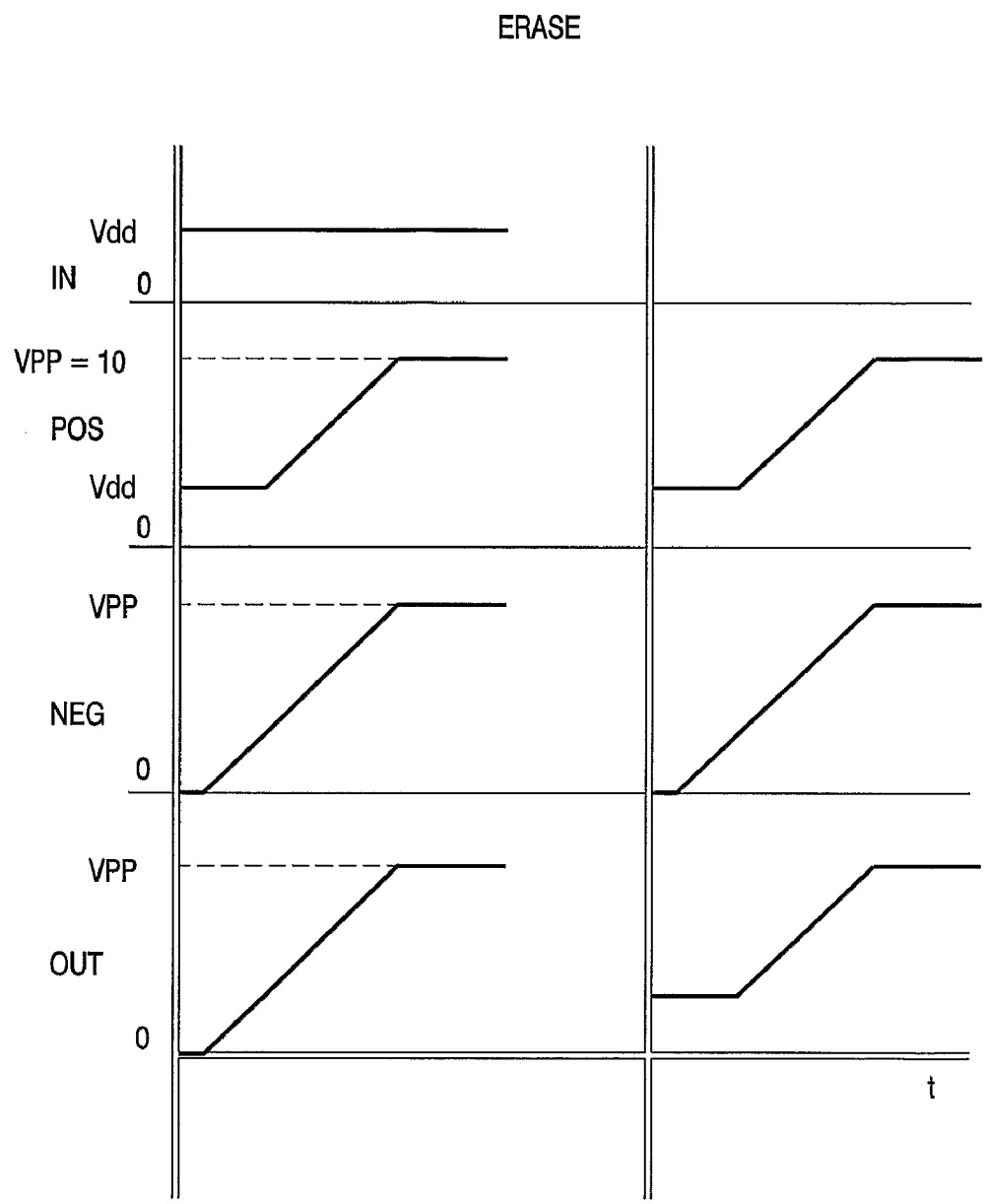

FIGS. 9a, b and c are timing diagrams in respect of a high voltage driver according to an exemplary embodiment of the present invention, when used as a select gate driver for a non-volatile memory device; and FIGS. 10a, b and c are timing diagrams in respect of a high voltage driver according to an exemplary embodiment of the present invention, when used as a sector select driver for a non-volatile memory device.

High voltage drivers can be implemented as inverters with high voltage transistors through which a high level input signal chooses between the two terminal voltages. The level shifter can be a latch (of high voltage transistors) into which data is written through a low voltage driver, protected from the high voltage by isolation transistors. The data is written in at logic level, and the terminal voltages ramp up to the high levels, taking the latch output with them.

Thus, in prior art devices such as non-volatile memories, the drivers use high voltage transistors to drive a heavily loaded output, such that the switching speed during low voltage operation (such as read operations) is reduced. For faster switching, the required size of the driver becomes quite large.

U.S. Pat. No. 6,407,579 describes a high voltage level shifter which can provide level shifted voltages for applications in memory circuits. The level shifter circuit includes a voltage level shifter and a separate output stage, which drives a load. The level shifter circuit, which comprises a plurality of high voltage devices, can be used to cause the output stage to drive the load at a high voltage or a low voltage, as required by the device operation to be achieved.

Conventional latch-type level shifters have the problem of cross currents during switching because of the presence of a latch. In addition, they need the isolation signals which are high voltage control signals. In many cases, it is only required to switch between Ground (Gnd) and a high positive voltage, or between Vdd and a negative voltage; or, as the case in KFLASH memory, although the level-shifter has to switch between high positive and negative voltages, this has to be done in two steps because the transistors cannot support the full voltage drop. In such cases, partial level shifters (i.e. separate positive and negative level shifters) have been proposed. These types of level shifter avoid cross currents, reduce the number of control signals and occupy less IC space, relative to prior art arrangements.

Figure 6A:
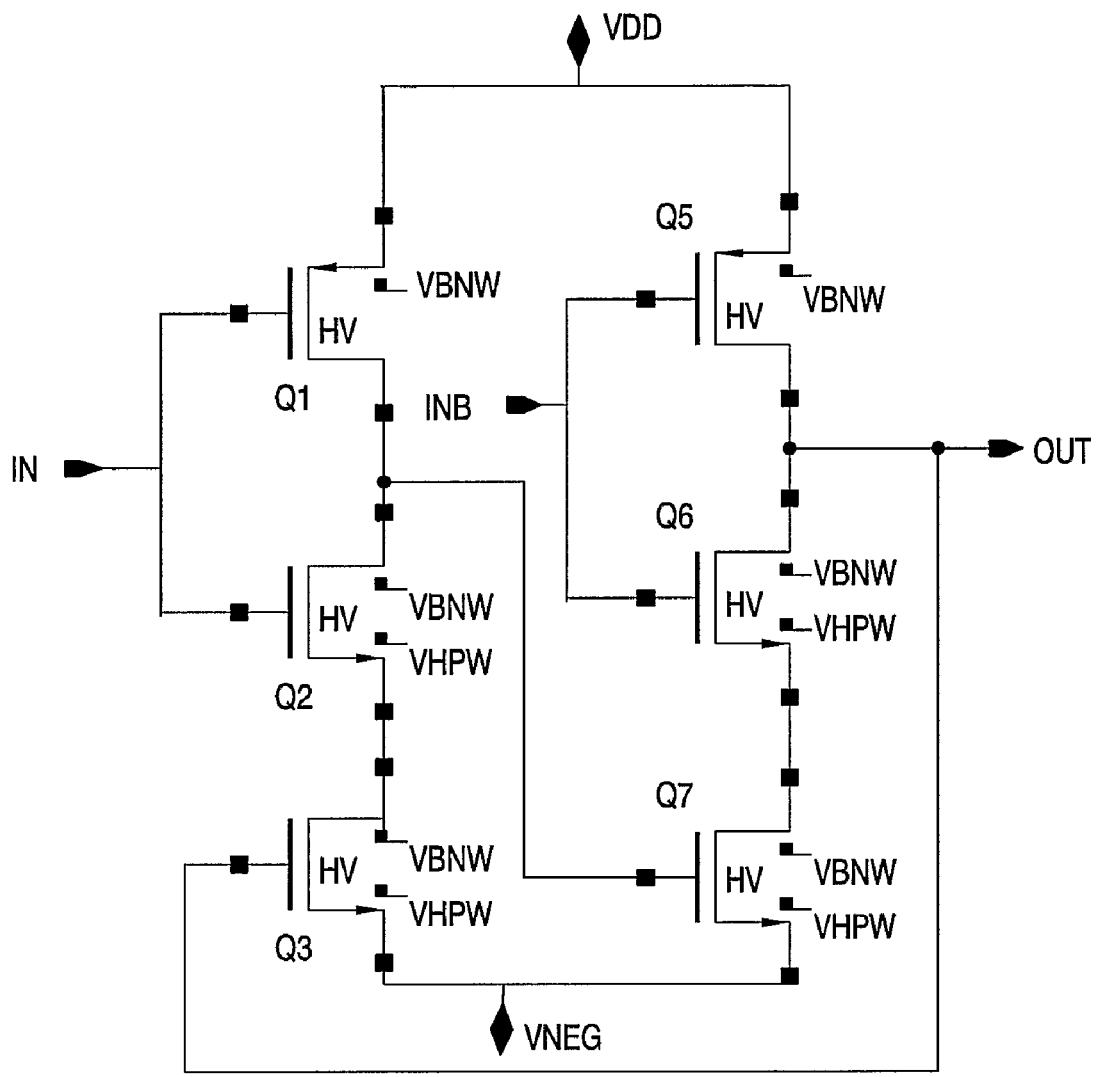
FIG. 6a is a schematic circuit diagram of a negative level shifter.

Referring to FIGS. 6a and b, respective negative and positive voltage level shifters are illustrated schematically in the form of circuit diagrams. As shown in FIG. 6a, in the case of a negative voltage level shifter, the logic level input IN is connected to an inverter formed by high voltage transistors Q1 and Q2. The drain of transistor Q1 is connected to VDD and the source of transistor Q2 is connected to the drain of a third high voltage transistor Q3, the source of which is connected to the negative voltage level VNEG, and the output of the inverter is connected to the gate of a fourth high voltage transistor Q4. A second input INB is connected to a second inverter formed by high voltage transistors Q5 and Q6, the source of transistor Q5 being connected to VDD and the source of transistor Q6 being connected to the drain of transistor Q4. The gate of transistor Q3 is connected to the output OUT of the second inverter.

The negative level shifter connects OUT to VDD or VNEG, depending on the value of the logic level input IN. VNEG is connected to Gnd while the input switches, and then is ramped down to the negative value. The feedback ensures that the output node remains connected to the same terminal, and there is no short-circuit current during ramp-up/-down. Speed of switching is affected almost entirely by the three transistors on the outside, i.e. Q4, Q5 and Q6, hence the size of the rest can be minimized.

Figure 6B:
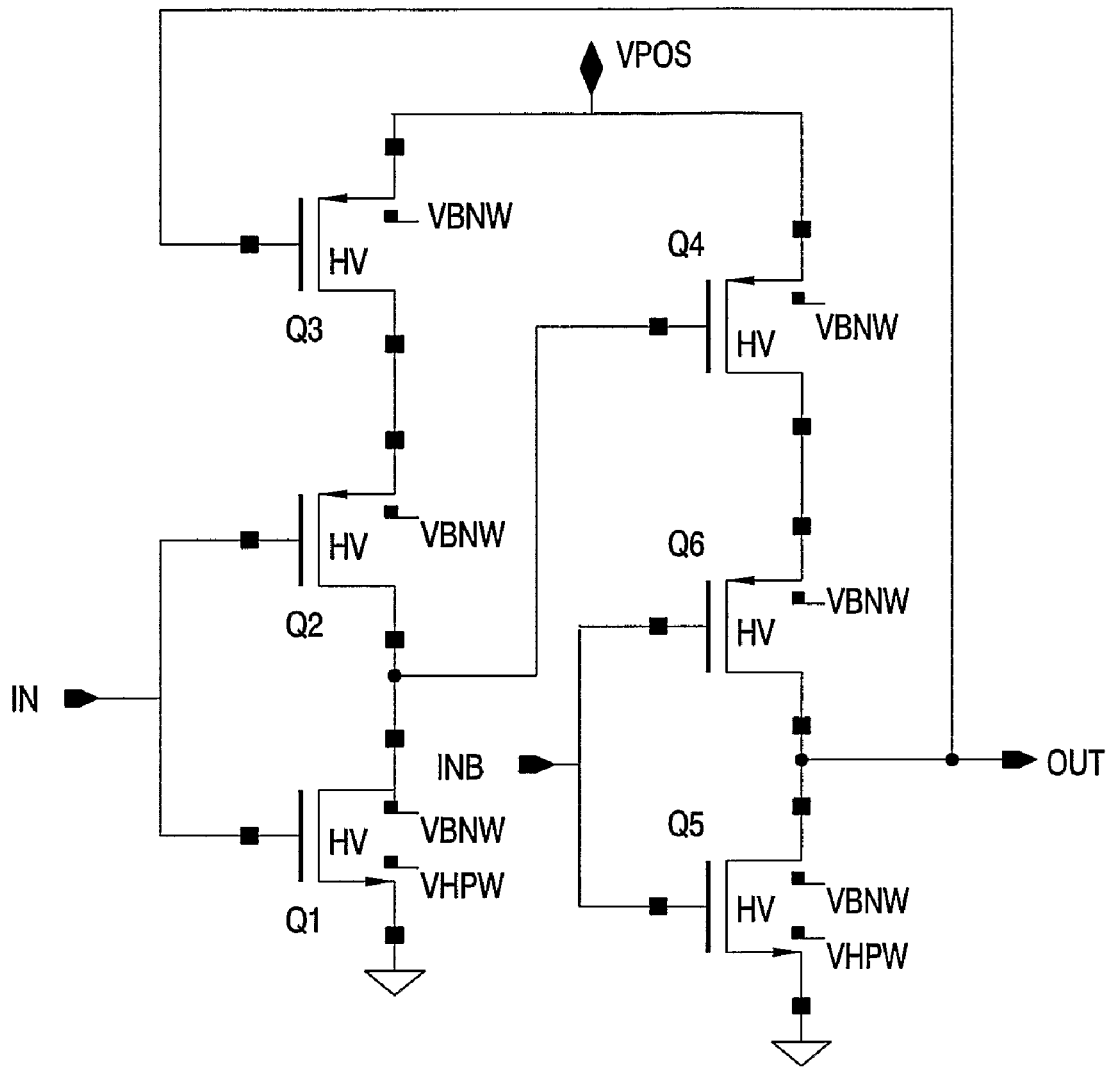
FIG. 6b is a schematic circuit diagram of a positive level shifter.

As shown in FIG. 6b, in the case of a positive voltage level shifter, the logic level input IN is connected to an inverter formed by high voltage transistors Q1 and Q2. The drain of transistor Q1 is connected to Gnd and the source of transistor Q2 is connected to the drain of a third high voltage transistor Q3, the source of which is connected to the positive voltage level VPOS, and the output of the inverter is connected to the gate of a fourth high voltage transistor Q4. A second input INB is connected to a second inverter formed by high voltage transistors Q5 and Q6, the source of transistor Q5 being connected to Gnd and the source of transistor Q6 being connected to the drain of transistor Q4. The gate of transistor Q3 is connected to the output OUT of the second inverter. It will be appreciated that the operation of the positive level shifter is, like its configuration, fully analogous to that of the negative level shifter.

Thus, in accordance with the present invention, by using low voltage transistors in combination with the high voltage devices, the logic level switching speed can be improved considerably, relative to prior art arrangements, while at the same time reducing driver area.

In certain applications (as in, for example, the select gate decoder in a KFLASH memory device), the mode of operation determines the value (positive or negative) to which all signals of a certain array should be driven during high voltage operation, as shown in Table 1 below:

TABLE 1

Node voltages at different phases of operation

|  | LV Phase | HV Phase 1 | HV Phase 2 |
| --- | --- | --- | --- |
| IN | 0/VDD | 0/VDD | 0/VDD |
| POS | VDD | VPOS | VNEG |
| NEG | 0 | VPOS | VNEG |
| VBNW (Nwell) | VDD | VPOS | 0 |
| OUT | VDD/0 | VPOS | VNEG |

Then, both the terminals of the driver can be ramped to this value so that the output gets this value independently of the input. During low voltage operation, however, the output is required to switch with the input, and to improve the speed of this switching in accordance with the invention, a low voltage part is added to the driver.

Figure 1:
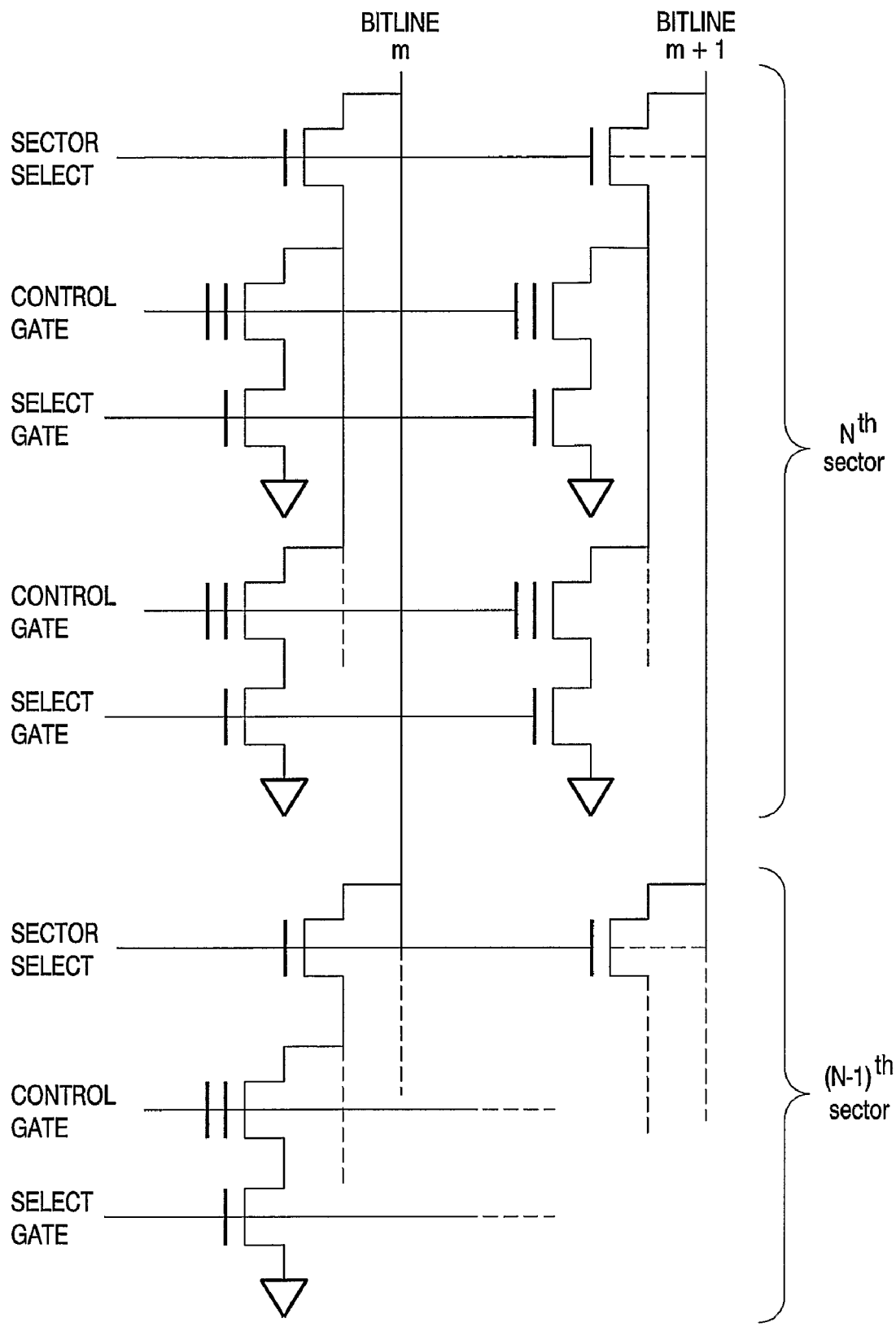
FIG. 1 is a schematic illustration of the organization of a flash memory device.
Figure 2:
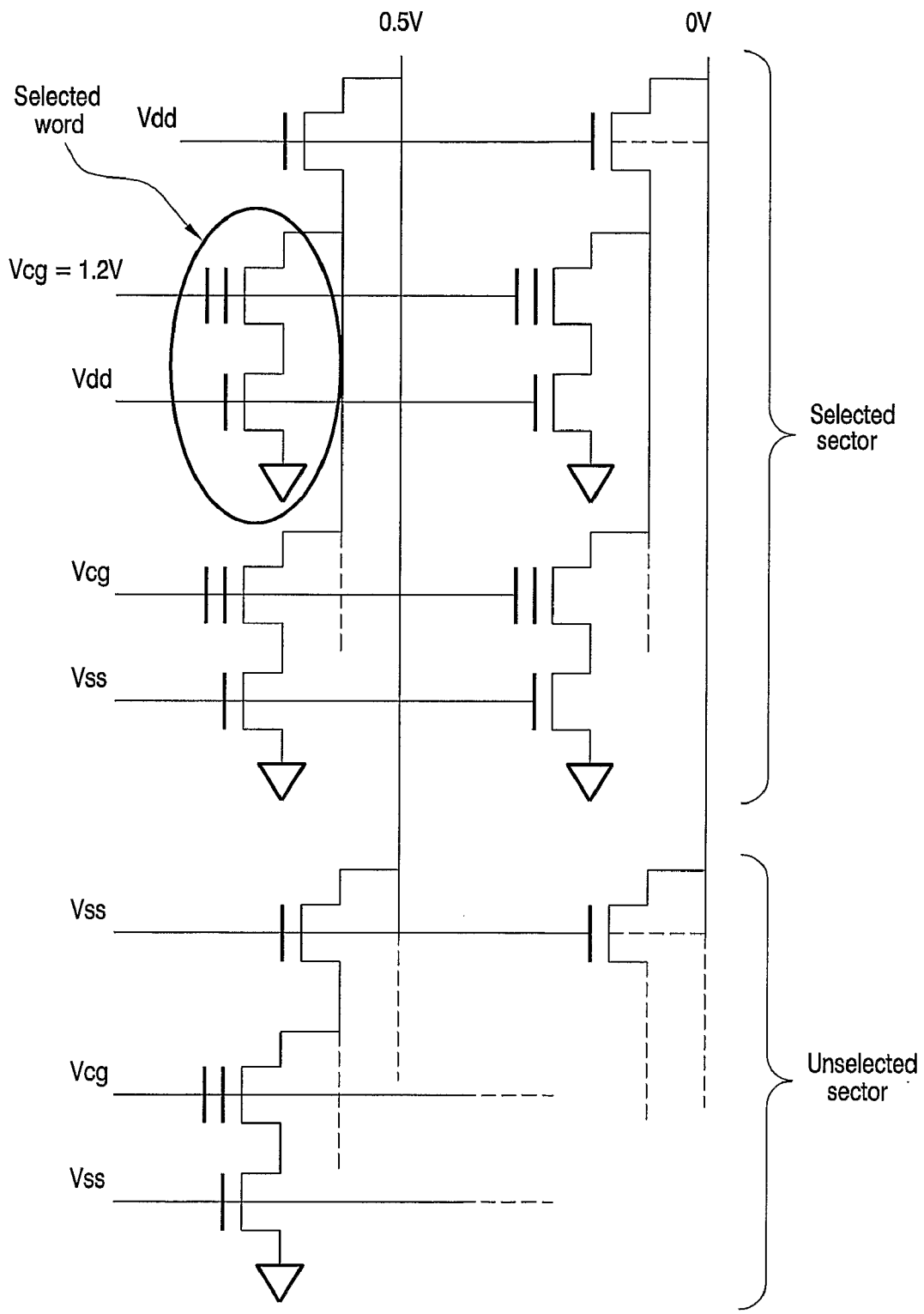
FIG. 2 illustrates schematically a read operation in the device of FIG. 1.
Figure 3:
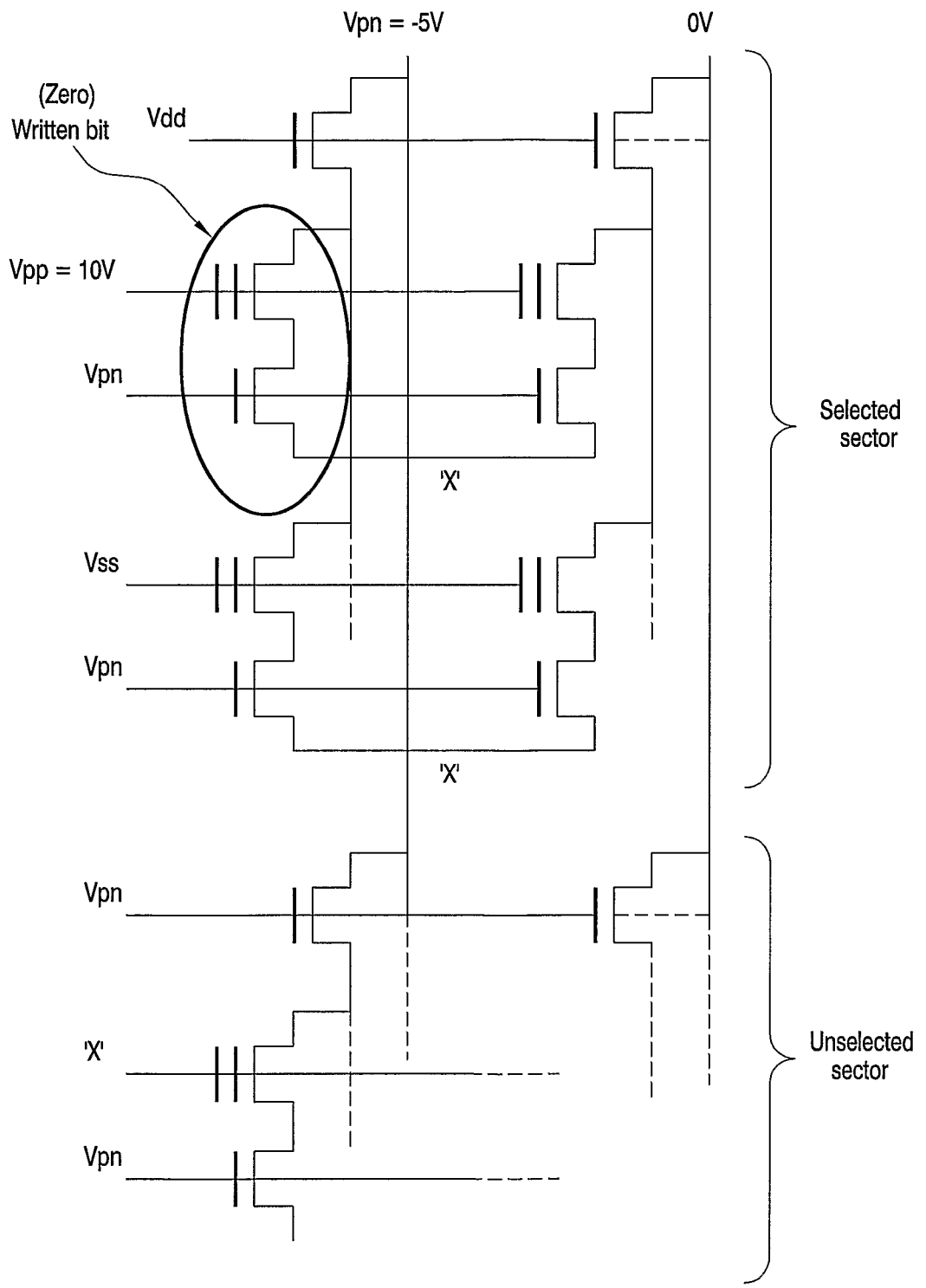
FIG. 3 illustrates schematically a write operation in the device of FIG. 1.
Figure 4:
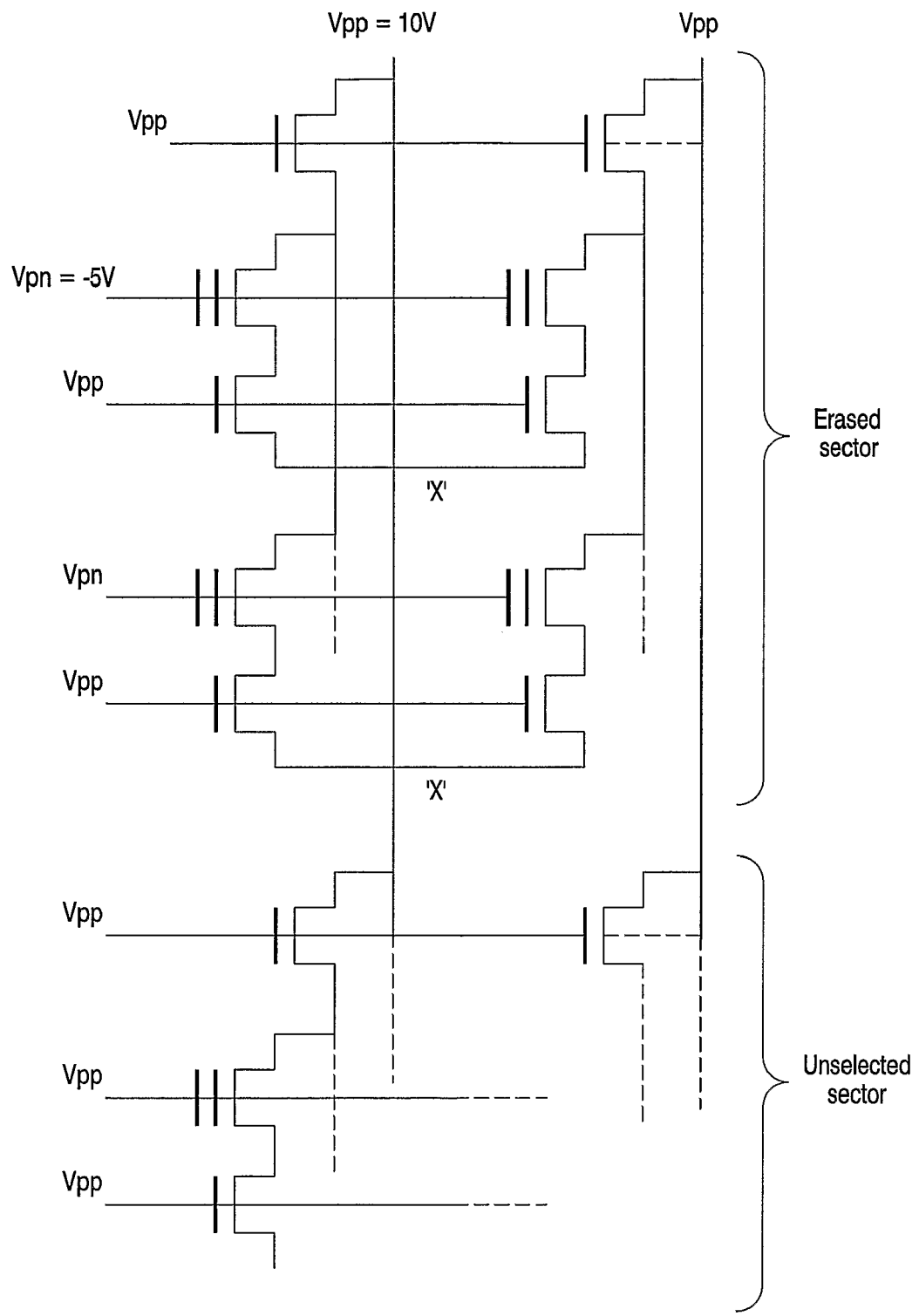
FIG. 4 illustrates schematically an erase operation in the device of FIG. 1.
Figure 5A:
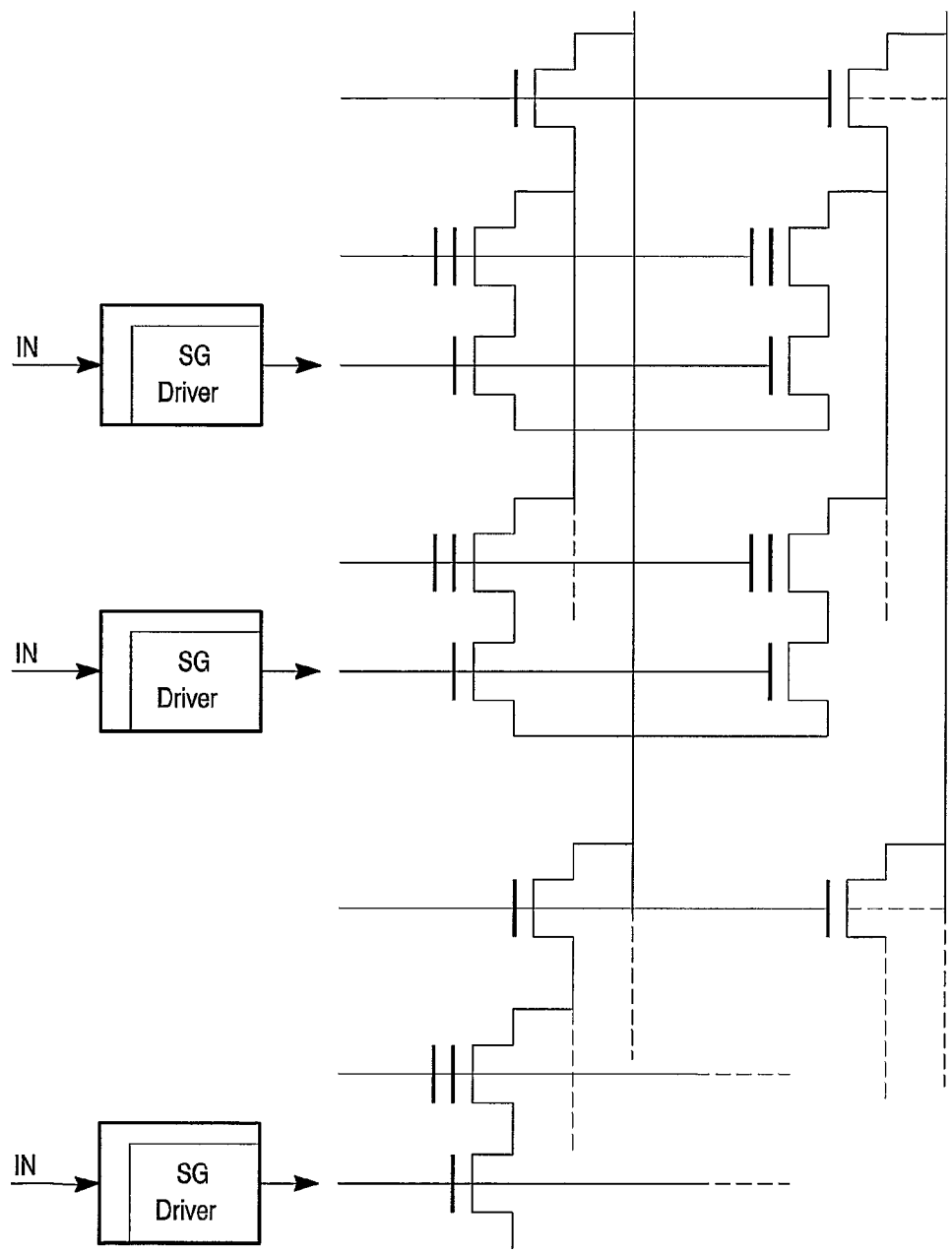
FIG. 5a illustrates schematically the arrangement of select gate drivers in the device of FIG. 1.
Figure 5B:
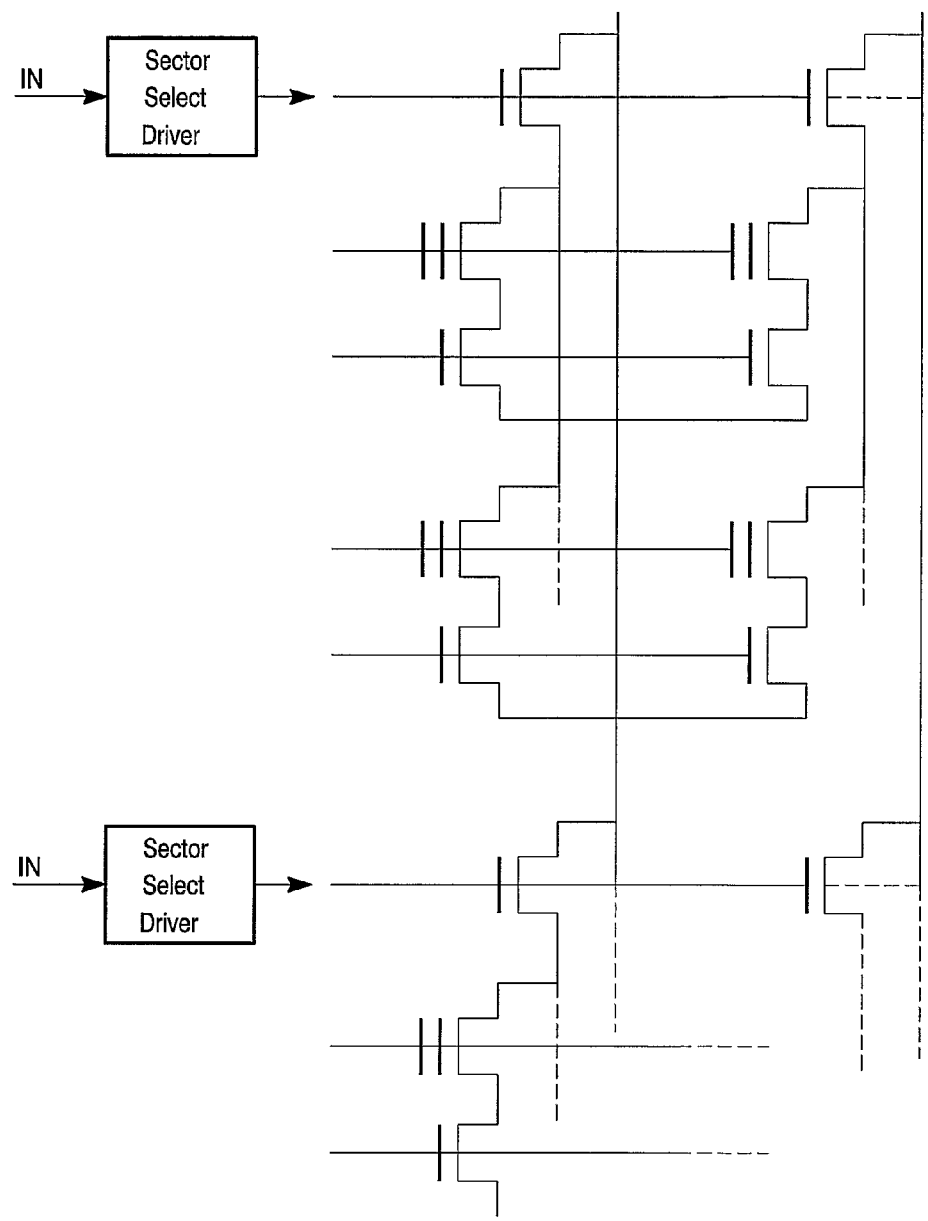
FIG. 5b illustrates schematically the arrangement of sector select drivers in the device of FIG. 1.

Referring to FIG. 5b of the drawings, the select gate driver of the flash memory device of FIG. 1 has to deliver the following voltages, depending on the row address selected:

|  | Mode: | | |
| --- | --- | --- | --- |
|  | READ | WRITE | ERASE |
| IN | 0/Vdd | 0/Vdd | 0/Vdd |
| OUT | Vdd/0 | Vpn = −5 V | Vpp = 10 V |

High voltage drivers can be relatively simply implemented as inverters with high voltage transistors through which a high level input signal chooses between two terminal voltages which may take the following values (in respect of the specific example given above):

|  | Mode: | | |
| --- | --- | --- | --- |
|  | READ | WRITE | ERASE |
| POS | Vdd | Vpn = −5 V | Vpp = 10 V |
| NEG | 0 | Vpn | Vpp |

The level shifter can be a latch (of high voltage transistors) into which data is written through a low voltage driver, protected from the high voltage by isolation transistors. The data is written in at logic level, and the terminal voltages ramp up to the high levels, taking the latch output with them. Problems arise, however, in respect of the switching speed during low voltage operation and, in order to solve these problems in accordance with a first exemplary embodiment of the present invention, a low voltage inverter is inserted in parallel into the circuit.

Figure 7:
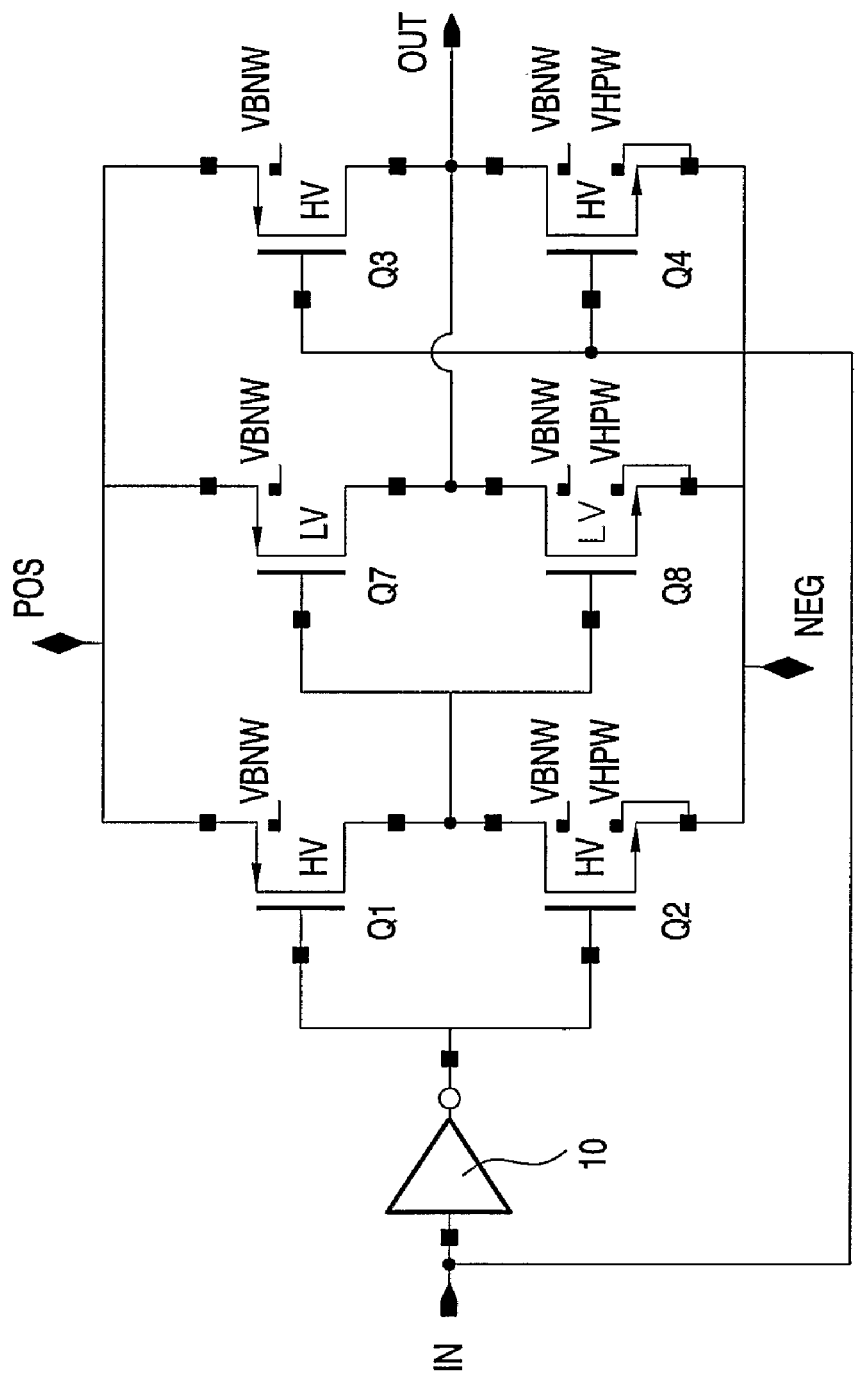
FIG. 7 is a schematic circuit diagram of a high voltage driver according to a first exemplary embodiment of the present invention.

Referring to FIG. 7 of the drawings, there is illustrated a driver according to a first exemplary embodiment of the present invention, having input-independent high voltage operation. The driver comprises a circuit defining two signal paths between the input and the output: a high voltage signal path and a low voltage signal path.

The logic level input IN is connected to a low voltage normal baseline, logic level inverter 10 connected between VDD and GND, the output of which inverter is connected to a second high voltage inverter formed by transistors Q1 and Q2. The source of Q1 is connected to VPOS and the source of Q2 is connected to VNEG. The output of the inverter formed by transistors Q1 and Q2 is connected to a low voltage inverter formed by transistors Q7 and Q8, the source of Q7 being connected to VPOS and the source of Q8 being connected to VNEG, and the output of the low voltage inverter is connected to the output OUT. In addition, the logic level input is connected to the input of another high voltage inverter formed by transistors Q3 and Q4, the source of Q3 being connected to VPOS and the source of Q4 being connected to VNEG, with the output of the Q3/Q4 inverter being connected to the output OUT.

The low voltage devices Q7, Q8 enable fast low voltage switching, and the output OUT can be taken to a negative or positive high voltage by ramping the NEG or POS terminals to this same voltage. Then, the node OUT is connected to the POS or NEG terminal via the NMOS transistor Q8 or the PMOS transistor Q7 respectively, independent of IN, since the latter is a low voltage signal. In this phase, high voltage comes across the gate and other terminals of the low voltage inverter, hence input to the low voltage driver should be from another high voltage driver, such that any voltage drop across the low voltage devices Q7, Q8 is prevented by the high voltage transistors Q1, Q2 feeding their gates. It will be appreciated by a person skilled in the art that for correct logic at the low voltage driver, inverted IN is fed to this device.

Timing diagrams in respect of the read, write and erase operations of a select gate driver implemented using the circuit of FIG. 7, are illustrated in FIGS. 9a B c respectively.

Applications in which the high voltage output is partially input dependent (e.g. during write operations) also exist, for example, in the sector select part of the X-decoder in a KFLASH memory device.

For example, referring back to FIG. 5b of the drawings, the sector select driver has to deliver the following voltages:

|  | Mode: | | |
| --- | --- | --- | --- |
|  | READ | WRITE | ERASE |
| IN | 0/Vdd | 0/Vdd | 0/Vdd |
| OUT | Vdd/0 | Vdd/Vpn (−5) | Vpp = 10 |

A level shifter (such as the one described with reference to FIG. 6a of the drawings is used for the write operation). In such cases, the positive and negative terminals will carry different voltages in at least part of the high voltage operation. This means that a low voltage driver cannot be connected at the output because of the voltage drop. However, if the nature of the output desired (determined by the application) is such as to allow certain additional flexibility in circuit design (for example, as in the sector select signal, the output is input-dependent only in part of the high voltage operation, and then the positive and negative voltages differ by only 7V instead of the 15V difference which would otherwise be possible), devices which are between HV and LV devices in terms of size and voltage capacity can be used.

Figure 8:
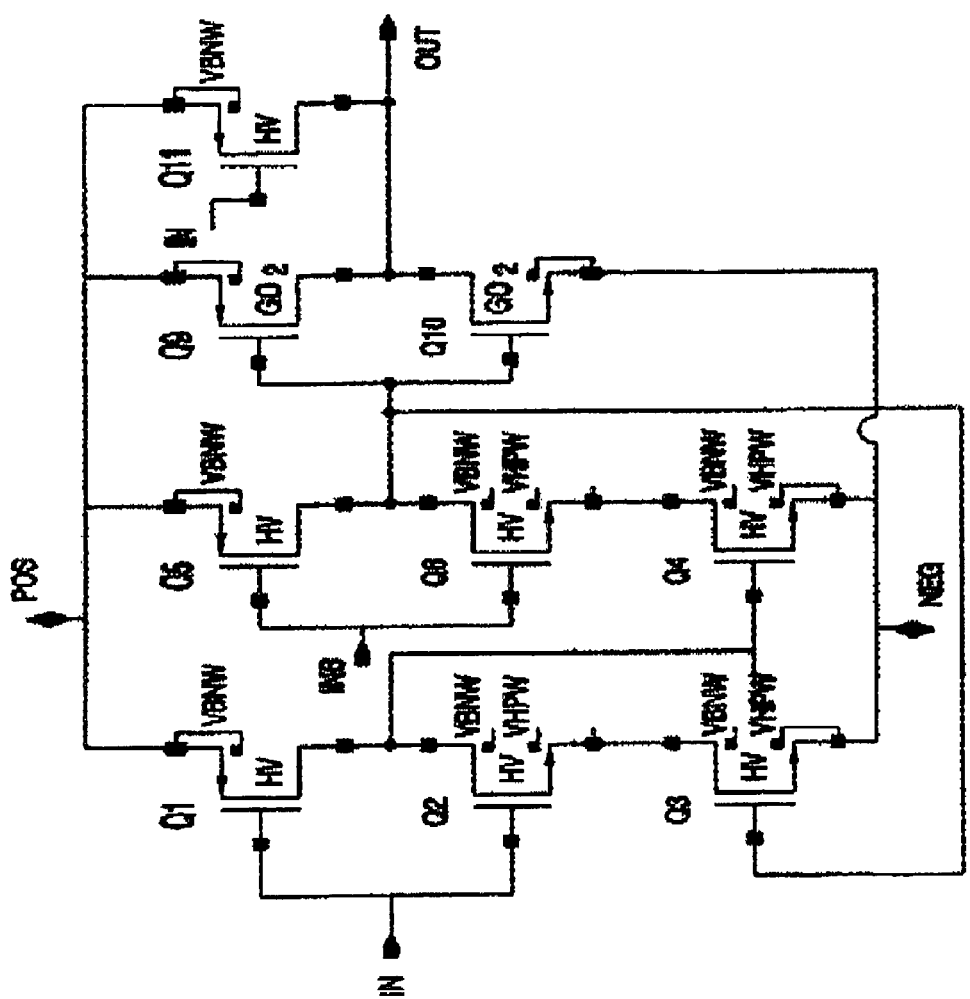
FIG. 8 is a schematic circuit diagram of a high voltage driver according to a second exemplary embodiment of the present invention.

Referring to FIG. 8 of the drawings, a driver circuit according to a second exemplary embodiment of the present invention is illustrated, in which $GO_2$ devices (i.e. high breakdown voltage MOS transistors whose gate oxide film is thick) are used at the output, which devices can support a drop of just 7V (in fact, they can support a voltage drop of approximately <8V), but have a higher drive than conventional high voltage devices. It will be appreciated that such $GO_2$ devices are already used in the output port, such that no additional cost is involved. The circuit of FIG. 8 is a driver with partial input dependence at high voltage, as will now be explained.

The application chosen requires the circuit to output:
1) high positive voltage irrespective of IN, when both positive and negative terminals are ramped to this voltage;
2) VDD or negative voltage, depending on the value of IN;
3) At low voltage, logic level output depending on IN.

This is summarized in Table 2 below:

TABLE 2

Node voltages of circuit at different phases of operation

|  | LV Phase | HV Phase 1 | HV Phase 2 |
| --- | --- | --- | --- |
| IN | 0/VDD | 0/VDD | 0/VDD |
| POS | VDD | VPOS | VDD |
| NEG | 0 | VPOS | VNEG |
| OUT | VDD/0 | VPOS | VDD/VNEG |

As shown, the first part of the circuit of FIG. 8 is the negative level shifter described with reference to FIG. 6a of the drawings. The $GO_2$ devices Q9, Q10 enable faster switching at logic level. When the terminals are ramped to VPP, the output is taken with them, through the pull-up HV transistor Q11 (which is required for the erase operation), and so are the gates of the $GO_2$ devices Q9, Q10, so there is no voltage drop across them. In the third phase, when POS goes to VDD and NEG goes to the high negative level, the level shifter connects the $GO_2$ gates to either POS or NEG as determined by IN, and OUT is driven to either terminal voltage by the $GO_2$ transistors Q9, Q10.

It will be appreciated that, in an alternative embodiment, the level shifter may be a positive level shifter, in which case, the transistor Q11 would be a pull-down transistor. Furthermore, in one embodiment, where the driver is implemented on an integrated circuit, the low voltage driver may be implemented using the IC=s existing I/O "pad protection inverter=, which then has a secondary use as a low voltage driver.

Timing diagrams in respect of the read, write and erase operations of a sector select driver implemented using the circuit of FIG. 8, are illustrated in FIGS. 10a B c respectively.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A voltage driver circuit for driving a device at a selected one of a plurality of voltages associated with respective device operations including a high voltage operation and a relatively lower voltage operation, the driver circuit comprising an input (IN), a single output (OUT) for connection to said device, and a plurality of voltage drivers between said input and said output including a high voltage breakdown driver and a relatively lower breakdown voltage driver, wherein said high voltage breakdown driver comprises inverters and said relatively lower breakdown voltage driver comprises an inverter, wherein an output of one of the inverters of said high voltage breakdown driver is connected to an input of the inverter of said relatively lower breakdown voltage driver, the circuit being arranged such that, during a high voltage operation, said high voltage breakdown driver is connected to said output and there is a substantially zero voltage drop across said relatively lower breakdown voltage driver, and, during a relatively lower voltage operation, said relatively lower breakdown voltage driver provides the drive voltage for driving said device, the contribution of said high breakdown voltage driver to said drive voltage during said relatively lower voltage operation being substantially negligible.

2. A circuit according to claim 1, wherein the inverters of said high voltage breakdown driver consist of high voltage breakdown transistors.

3. A circuit according to claim 2, wherein the inverter of said relatively lower breakdown voltage driver consists of relatively lower breakdown voltage transistors.

4. A circuit according to claim 3, wherein source electrodes of some high voltage breakdown transistors and a source electrode of a first relatively lower breakdown voltage transistor are connected to a first voltage line, wherein source electrodes of some other high voltage breakdown transistors and a source electrode of a second relatively lower breakdown voltage transistor are connected to a second voltage line.

5. A circuit according to claim 1, comprising two signal paths between the input and the output, a first signal path consisting of one or more high voltage drivers connected in series, and a second signal path consisting of at least one low voltage driver, the first and second signal paths being connected in parallel to one another.

6. A circuit according to claim 5, comprising means for selecting the first signal path during high voltage operation.

7. A memory device, comprising a voltage driver circuit according to claim 1.

8. An integrated circuit, comprising or including a memory device according to claim 7.

9. A computing system, including an integrated circuit according to claim 8.

10. A voltage driver circuit for driving a device at a selected one of a plurality of voltages associated with respective device operations including a high voltage operation and a relatively lower voltage operation, the driver circuit comprising an input (IN), a single output (OUT) for connection to said device, and a plurality of voltage drivers between said input and said output including a high voltage breakdown driver and a relatively lower breakdown voltage driver, wherein the high breakdown voltage driver comprises a voltage level shifter that is connected at the input of the circuit that is between first and second voltage lines and the relatively lower breakdown voltage driver comprises an inverter, wherein an output of said voltage level shifter is connected to an input of the inverter of the relatively lower breakdown voltage driver and the inverter of the relatively lower breakdown voltage driver is connected to the single output, the voltage driver circuit being arranged such that, during a high voltage operation, there is a substantially zero voltage drop across said relatively lower breakdown voltage driver.

11. A circuit according to claim 10, wherein said voltage level shifter comprises a partial level shifter.

12. A circuit according to claim 10 wherein the inverter of said relatively lower breakdown voltage driver consists of thick gate oxide devices.

13. A circuit according to claim 12, wherein the thick gate oxide devices comprise $GO_2$ devices.

14. A circuit according to claim 12, wherein the voltage level shifter comprises transistors, wherein source electrodes of some transistors of the voltage level shifter and a source electrode of a first thick gate oxide device are connected to the first voltage line, wherein source electrodes of some other transistors of the voltage level shifter and a source electrode of a second thick gate oxide device are connected to the second voltage line.

15. A circuit according to claim 10, wherein said relatively lower breakdown voltage driver comprises an I/O protection inverter.

16. A circuit according to claim 10, wherein a high voltage pull-up or pull-down transistor is provided between the output and the first or second voltage lines respectively.

* * * * *